(12) United States Patent
Wendt et al.

(10) Patent No.: US 9,541,582 B2
(45) Date of Patent: Jan. 10, 2017

(54) DC POWER DISTRIBUTION SYSTEM

(71) Applicant: KONINKLIJKE PHILIPS N.V., Eindhoven (NL)

(72) Inventors: Matthias Wendt, Würselen (DE); Adrianus Johannes Stephanus Maria De Vaan, 'S-Hertogenbosch (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 135 days.

(21) Appl. No.: 14/424,453

(22) PCT Filed: Feb. 27, 2013

(86) PCT No.: PCT/IB2013/051557
§ 371 (c)(1),
(2) Date: Feb. 27, 2015

(87) PCT Pub. No.: WO2014/033558
PCT Pub. Date: Mar. 6, 2014

(65) Prior Publication Data
US 2015/0253360 A1    Sep. 10, 2015

Related U.S. Application Data

(60) Provisional application No. 61/695,600, filed on Aug. 31, 2012.

(51) Int. Cl.
| | | |
|---|---|---|
| *G01R 19/10* | (2006.01) | |
| *H05B 37/02* | (2006.01) | |
| *G01R 31/02* | (2006.01) | |
| *H02J 1/00* | (2006.01) | |

(52) U.S. Cl.
CPC ............ *G01R 19/10* (2013.01); *G01R 31/021* (2013.01); *H02J 1/00* (2013.01); *H05B 37/0245* (2013.01); *H05B 37/0254* (2013.01); *Y10T 307/305* (2015.04)

(58) Field of Classification Search
CPC .............................. G01R 19/10; G01R 31/021
USPC .......................................................... 307/43
See application file for complete search history.

(56) References Cited

U.S. PATENT DOCUMENTS

| | | | |
|---|---|---|---|
| 5,680,054 A | 10/1997 | Gauthier | |
| 6,737,763 B2 * | 5/2004 | Liu | ........... H02J 1/102 307/58 |
| 6,838,999 B1 | 1/2005 | Roepke | |

FOREIGN PATENT DOCUMENTS

| | | |
|---|---|---|
| EP | 1284556 A1 | 2/2003 |
| EP | 2007077 A1 | 12/2008 |
| FR | 2919070 A1 | 1/2009 |
| JP | 2009165251 A | 7/2009 |
| WO | 2008099305 A1 | 8/2008 |

(Continued)

*Primary Examiner* — Daniel Kessie

(57) ABSTRACT

The invention relates to a DC power distribution system (1). The DC power distribution system comprises a track (2) with electrical conductors for distributing DC power for powering purposes and for position determination purposes and a position determination system (15) for determining the position of an electrical device (3, 13) like a luminaire, which is attached to the track, based on a voltage measured on the track. The DC power distribution system can therefore provide positioning information regarding the position of the electrical device along the track, which may be useful, for instance, for commissioning purposes.

11 Claims, 7 Drawing Sheets

(56) References Cited

FOREIGN PATENT DOCUMENTS

| WO | 2009069062 A1 | 6/2009 |
| WO | 2010004461 A2 | 1/2010 |
| WO | 2013128354 A1 | 9/2013 |

* cited by examiner

DC POWER DISTRIBUTION SYSTEM

CROSS-REFERENCE TO PRIOR APPLICATIONS

This application is the U.S. National Phase application under 35 U.S.C. §371 of International Application No. PCT/IB2013/051557, filed on Feb. 27, 2013, which claims the benefit of U.S. Provisional Patent Application No. 61/695,600, filed on Aug. 31, 2012. These applications are hereby incorporated by reference herein.

FIELD OF THE INVENTION

The invention relates to a DC power distribution system, a track of the DC power distribution system, to which an electrical device is attachable, and a position determination system, a position determination method and a computer program for determining the position of the electrical device along the track.

BACKGROUND OF THE INVENTION

A DC power distribution system is defined by, for instance, the EMerge Alliance Occupied Space standard (EMerge standard). Currently, in a DC power distribution system in accordance with the EMerge standard one or several power supply units are electrically connected to a track for providing DC power to one or several electrical consumers like luminaires, which are also electrically connected to the track. The one or several power supply units and the one or several electrical consumers can be attached at any position along the track. However, after the respective power supply unit or electrical consumer has been attached to the track, positioning information about the power supply unit or about the electrical consumer is not available. Such positioning information may be valuable for, for instance, commissioning purposes.

SUMMARY OF THE INVENTION

It is an object of the present invention to provide a DC power distribution system being adapted to provide positioning information regarding electrical devices like power supply units or electrical consumers attached to a track of the DC power distribution system. The invention relates further to a track of the DC power distribution system being adapted to allow the DC power distribution system to provide the positioning information and to a position determination system, a position determination method and a computer program for determining a position of an electrical device along the track within the DC power distribution system.

In a first aspect of the present invention a DC power distribution system is presented, wherein the DC power distribution system comprises:

a track comprising electrical conductors arranged along the length of the track for distributing DC power along the track for powering purposes and for position determination purposes, an electrical device attached to the track and electrically connected to the electrical conductors, wherein the electrical device comprises a voltage measurement unit for measuring the voltage on at least one of the electrical conductors at the position of the electrical device, a position determination system for determining the position of the electrical device based on the measured voltage, a DC power supply system electrically connected to at least one of the electrical conductors for supplying DC power to the at least one of the electrical conductors.

Since the electrical device comprises a voltage measurement unit for measuring the voltage on at least one of the electrical conductors at the position of the electrical device and since the position determination system determines the position of the electrical device based on the measured voltage, the DC power distribution system can provide positioning information regarding the position of the electrical device along the track, which may be useful, for instance, for commissioning purposes.

The electrical conductors can be, for instance, resistive wires, resistive layers, et cetera. In an embodiment the electrical conductors include a first electrical conductor for distributing a first DC power for powering purposes and a second electrical conductor for distributing a second DC power for position determination purposes, wherein the voltage measurement unit is adapted to measure the voltage on the second electrical conductor. Thus, the track, which may also be regarded as being a bus bar component, can comprise an additional electrical conductor for providing the DC power for determining the position of the electrical device. The separation of the distribution of the second DC power for position determination purposes from the distribution of the first DC power for powering purposes can reduce generally possible interferences between the distribution of the first DC power and the second DC power and can therefore improve the quality of the voltage measurement, thereby improving the quality of the position determination procedure. The electrical conductors may be regarded as being bus bar component conductors.

The DC power supply system is preferentially electrically connected to the first electrical conductor for supplying the first DC power and to the second electrical conductor for supplying the second DC power. The electrical device is preferentially an electrical consumer, which may be regarded as being a peripheral, or a DC power supply unit, which may be regarded as a power supply module, of the DC power supply system. In particular, the DC power distribution system can comprise several electrical devices including one or several electrical consumers and one or several power supply units of the DC power supply system, wherein the one or several electrical consumers are electrically connected to the first electrical conductor for receiving the first DC power and wherein the one or several DC power supply units are electrically connected to the first electrical conductor for supplying the first DC power.

In an embodiment, the DC power supply system comprises a position power source supplying the second DC power. The position power source can be a voltage source or a current source. Moreover, the electrical conductors can comprise a reference electrical conductor, wherein the position power source can comprise a first connection to the reference electrical conductor and a second connection to a first end of the second conductor and wherein a second end of the second electrical conductor can be electrically connected to the reference electrical conductor. Also by providing a separate power source for providing the second DC power for determining the positioning information the power supply for powering purposes and the power supply for position determination purposes can be more separated, which can lead to reduced interferences or no interference at all between the provision of the different DC powers, thereby allowing for a further improved quality of the voltage measurement and thus of the determination of the position of the electrical device along the track.

In a further embodiment, the first electrical conductor is electrically connected to the second electrical conductor for using the first DC power provided on the first electrical conductor for providing the second DC power on the second electrical conductor. In particular, the electrical conductors can comprise a reference electrical conductor, wherein one end of the second electrical conductor can be electrically connected to the first electrical conductor and the other end of the second electrical conductor can be electrically connected to the reference electrical conductor. Or, a resistor can connect the first electrical conductor and a first end of the second electrical conductor, wherein a second end of the second electrical conductor can be electrically connected to the reference electrical conductor. Thus, an additional power source for providing DC power to be used for determining the position of the electrical device along the track may not be needed, which can lead to reduced costs and a simplified installation of the DC power distribution system.

The DC power supply system can be adapted to supply a constant voltage to at least one of the electrical conductors at which the voltage is measured for supplying DC power to be used for position determination purposes, wherein the position determination system can be adapted to determine the position based on the ratio of the measured voltage and the constant voltage applied to the at least one electrical conductor. Alternatively, the DC power supply system can be adapted to supply a constant current to at least one of the electrical conductors, at which the voltage is measured, for supplying DC power to be used for position determination purposes, wherein in this case the position determination system can be adapted to determine the position based on the measured voltage, the constant current applied to the at least one electrical conductor and the resistance per length unit of the at least one electrical conductor at which the voltage is measured. In any case, the position of the electrical device along the track can therefore relatively easily be determined based on only a single measurement.

The DC power distribution system can comprise a multitude of the electrical devices, wherein the DC power supply system includes several position power providing units for providing DC power to at least one of the electrical conductors for position determination purposes, wherein the position power providing units are assigned to the electrical devices, wherein the position determination system can be adapted to determine the position of a first electrical device of the multitude of electrical devices relative to the position of a second electrical device of the multitude of electrical devices based on the voltage measured by one of the first and second electrical devices, while the position power providing unit assigned to the other of the first and second electrical devices has provided the DC power to the at least one of the electrical conductors. In particular, the DC power distribution system can be adapted such that the position power providing units provide the DC power for position determination purposes temporally sequentially, wherein if a position power providing unit assigned to a certain electrical device supplies the DC power for position determination purposes, the voltage measurement units of the other electrical devices measure the respective voltage, wherein the position determination system is adapted to determine the positions of these electrical devices relative to the certain electrical device based on the measured respective voltages. Thus, relative positions, i.e. the position of one electrical device relative to another electrical device, can be determined for providing the positional information.

The DC power supply system can also be adapted to provide the same DC power on the same electrical conductor for powering purposes and for position determination purposes. Thus, in an embodiment different electrical conductors for separately supplying a first DC power for powering purposes and a second DC power for position determination purposes may not be needed, thereby simplifying the DC power distribution system.

The track may be formed by several track segments, wherein the electrical device may be attached to a track segment of the several track segments such that by determining the position of the electrical device the position of the track segment, to which the electrical device is attached, within the track is determined. Thus, in an embodiment the electrical device can be adapted to determine the position of a track segment within the track. The electrical device can be adapted to, for instance, be attached to a frontal end of the respective track segment. In particular, the electrical device can be adapted to connect two track segments by being attached two opposing frontal ends of two neighboring track segments. The electrical device can therefore be regarded as being a connection element. The connection element is preferentially adapted to connect the several electrical conductors of the two neighboring track segments such that power can be distributed via the connection element. The electrical device used for determining the position of a track segment can also be integrated in the respective track segment such that the track segment is already provided with the electrical device, which may be attached inside the respective track segment or within a housing of the respective track segment.

The DC power distribution system preferentially further comprises a control system for controlling at least one of the electrical device and the DC power supply system depending on the determined position. For instance, if the electrical devices include several luminaires and several presence detectors for detecting whether a person is close to the respective presence detector, the control system can be adapted to control the luminaires, which are close to a certain presence detector, depending on whether this certain presence detector has detected the presence of a person or not. For providing this kind of control the determined positions of the luminaires and of the presence detectors can be used. For instance, the control system can determine assignments between a presence detector and one or several luminaires close to the presence detector, for instance, having a distance to the presence detector being smaller than a predefined threshold, wherein these assignments can be determined based on the determined positions of the luminaires and of the presence detectors. The control system can then control a luminaire depending on whether a presence detector, which has been assigned to this luminaire, detects the presence of a person or not. Moreover, if the electrical devices include several luminaires, the control system can be adapted to control the luminaires depending on their determined positions, in order to provide predefined light effects. For example, the control system can be adapted such that a guiding light effect is provided dragging a person's eye to a certain position like the center of the installation. The determined position information, i.e. the determined positions of the luminaires, can therefore be used by the control system to address the luminaires depending on a predefined location sequence, which defines when light should be provided at which position. The control system can, for instance, be adapted to provide a chasing light effect depending on the determined positions of the luminaires.

The DC power distribution system can further comprise an installation assisting unit for assisting an installer in installing an additional electrical device, wherein the installation assisting unit can be adapted to determine a preferred installation position on the track for the additional electrical device based on the determined position of the electrical device already attached to the track. The installation assisting unit can comprise installation rules, which define preferred installation positions based on the positions of the electrical devices already attached to the track. For instance, if the electrical devices are electrical consumers and power supply units, the installation rules can define that the loads caused by the electrical consumers should be evenly distributed among the power supply units. Thus, for instance, if the determined positions of the electrical consumers and of already attached power supply units indicate a cumulation of electrical consumers in a certain region along the track, whereas all or most power supply units are attached in other regions on the track, the installation assisting unit can determine a preferred installation position for an additional power supply unit being close to the region with the cumulated electrical consumers. The installation assisting unit can comprise an indication unit like a display for indicating the determined preferred installation position.

In a further aspect of the present invention a track being adapted to be used in the DC power distribution system as defined in claim 1 is presented, wherein the track comprises electrical conductors arranged along the length of the track for distributing DC power along the track for powering purposes and for position determination purposes.

In a further aspect of the present invention a position determination system being adapted to be used in the DC power distribution system as defined in claim 1 is presented, wherein the position determination system is adapted to determine the position of the electrical device based on the measured voltage.

In another aspect of the present invention a position determination method for determining a position of an electrical device along a track within a DC power distribution system is presented, wherein the position determination method comprises:

distributing DC power along the track for powering purposes and for position determination purposes by using the electrical conductors of the track arranged along the length of the track, wherein the DC power is supplied by the DC power supply system electrically connected to at least one of the electrical conductors, measuring a voltage on at least one of the electrical conductors at a position of the electrical device attached to the track and electrically connected to the electrical conductors by the voltage measurement unit of the electrical device, determining the position of the electrical device based on the measured voltage by the position determination system.

In a further aspect of the present invention a computer program for determining a position of an electrical device along a track within a DC power distribution system is presented, wherein the computer program comprises program code means for causing a DC power distribution system as defined in claim 1 to carry out the steps of the position determination method as defined in claim 14, when the computer program is run on a computer controlling the DC power distribution system.

It shall be understood that the DC power distribution system of claim 1, track of claim 12, the position determination system of claim 13, the position determination method of claim 14 and the computer program of claim 15 have similar and/or identical preferred embodiments, in particular, as defined in the dependent claims.

It shall be understood that a preferred embodiment of the invention can also be any combination of the dependent claims with the respective independent claim.

These and other aspects of the invention will be apparent from and elucidated with reference to the embodiments described hereinafter.

DETAILED DESCRIPTION OF EMBODIMENTS

Figure 1:
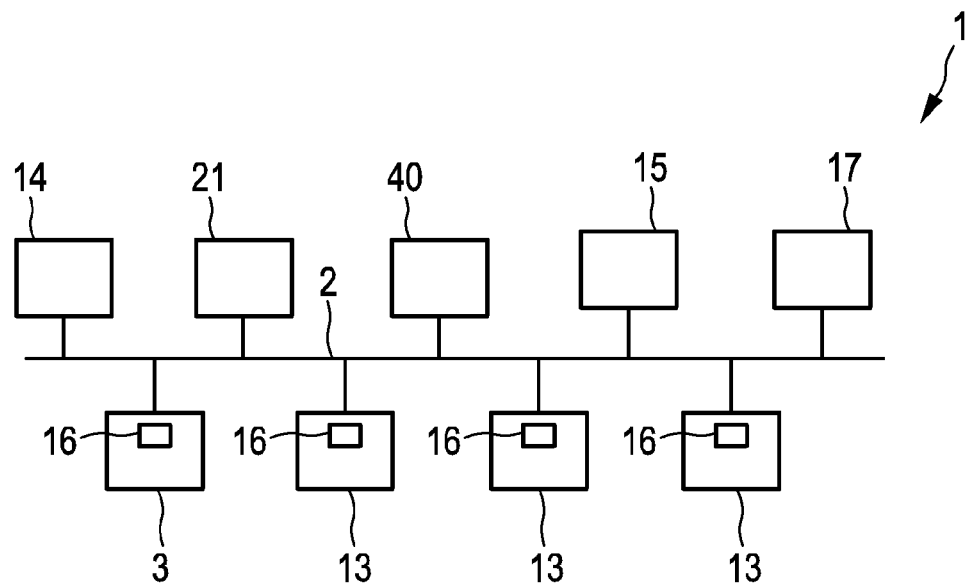
FIG. 1 shows schematically and exemplarily an embodiment of a DC power distribution system.

FIG. 1 shows schematically and exemplarily an embodiment of a DC power distribution system. The DC power distribution system comprises a track 2 which may be regarded as being a bus bar component and which is schematically and exemplarily shown in more detail in FIG. 2. The track 2 comprises several electrical conductors 4 . . . 11, which may be regarded as being bus bar component conductors, and a carrying element 12 for carrying the electrical conductors 4 . . . 11. In this embodiment the carrying element is a substantially U-shaped profile 12. The several electrical conductors 4 . . . 11 are used for different purposes. A first electrical conductor 6 is used for distributing a first DC power for powering purposes, a second electrical conductor 8 is used for distributing a second DC power for position determination purposes, third electrical conductors 4, 5 are used for distributing alternating current (AC) power and fourth electrical conductors 9, 10, 11 are used for communication purposes. Moreover, the electrical conductors include a reference electrical conductor 7 being preferentially a ground conductor. The electrical conductors 4 . . . 11 are arranged along the length of the track 2. The second electrical conductor 8 is preferentially a resistive wire, i.e. a wire having a relatively high resistance being larger than the resistance of, for instance, the first electrical conductor 6. The resistive wire used as second electrical conductor 8 can be made from, for instance, constantan. Moreover, the reference electrical conductor 7 has preferentially also a relatively low resistance, i.e. a resistance being smaller than the resistance of the second electrical conductor 8 and being preferentially similar to the resistance of the first electrical conductor 6. The first electrical conductor 6 and the reference electrical conductor 7 may be copper wires. Also the third electrical conductors 4, 5 and/or the fourth electrical conductors 9, 10, 11 may have relatively small resistances, i.e. resistances being smaller than the resistance of the second electrical conductor 8, and may also be copper wires.

The DC power distribution system further comprises several electrical devices 3, 13 attached to the track 2 and electrically connected to the electrical conductors, wherein the electrical devices 3, 13 comprise each a voltage measurement unit 16 for measuring the voltage on at least one of the electrical conductors at the position of the respective electrical device 3, 13. In this embodiment the respective voltage measurement unit 16 is adapted to measure the voltage on the second electrical conductor 8, i.e. between the reference electrical conductor 7 and the second electrical conductor 8.

The DC power distribution system 1 further comprises a position determination system 15 for determining the positions of the electrical devices 3, 13 based on the respective measured voltage and a DC power supply system electrically connected to some of the electrical conductors for supplying DC power to the electrical conductors. In particular, the DC power supply system is electrically connected to the first electrical conductor 6 for supplying the first DC power and to the second electrical conductor 8 for supplying the second DC power. In particular, for supplying the first DC power the DC power supply system is electrically connected to the first electrical conductor 6 and to the reference electrical conductor 7 and for supplying the second DC power the DC power supply system is electrically connected to the second electrical conductor 8 and to the reference electrical conductor 7.

The electrical devices 3, 13 include a power supply unit 3 and electrical consumers 13 like luminaires, sensors such as presence sensors for detecting the presence of a person in a room, loudspeakers, et cetera. The electrical consumers may be regarded as being peripherals and the power supply unit may be regarded as being a power supply module. The power supply unit 3 is electrically connected to the third electrical conductors 4, 5 for receiving AC power from an AC power supply 14. The AC power supply 14 is preferentially the AC means power supply of a building in which the DC power distribution system 1 is preferentially installed. The power supply unit 3 forms the part of the DC power supply system providing the first DC power for powering purposes. The DC power supply system further comprises a position power source 17 for supplying the second DC power for position determination purposes. The position power source 17 can be a voltage source for applying a constant voltage or a current source for supplying a constant current. The electrical connections of the power supply unit 3, the electrical consumers 13 and the position power source 17 to the first electrical conductor 6, the second electrical conductor 8 and the reference electrical conductor 7 are schematically and exemplarily shown in FIG. 3.

The position power source 17 comprises a first connection to the reference electrical conductor 7 and a second connection to a first end of the second electrical conductor 8, wherein a second opposing end of the second electrical conductor 8 is electrically connected to the reference electrical conductor 7 by using a connection element 18 like a jumper.

The power supply unit 3 is also electrically connected to the reference electrical conductor 7 and supplies the first DC power to the first electrical conductor 6. Moreover, the voltage measurement unit 16 of the power supply unit 3 is electrically connected to the second electrical conductor 8 for measuring the voltage at the position at which the power supply unit 3 is attached to the track 2.

The electrical consumer 13 is also electrically connected to the reference electrical conductor 7 and to the first electrical conductor 6 for receiving the first DC power for powering the electrical consumer 13 and the voltage measurement unit 16 of the electrical consumer 13 is electrically connected to the second electrical conductor 8 for measuring the voltage at the position at which the electrical consumer 13 is attached to the track 2. It should be noted that FIG. 3 only shows a single electrical consumer 13 for illustrating preferred electrical connections to the electrical conductors 6, 7, 8, wherein the further electrical consumers 13 have preferentially similar electrical connections to the electrical conductors 6, 7, 8.

If the position power source 17 is a voltage source for supplying a constant voltage to the second electrical conductor 8, the position determination system 15 is preferentially adapted to determine the ratio of the measured voltage and the constant voltage applied to the second electrical conductor 8 and to determine the position of the respective electrical device 3, 13 based on this determined ratio. In particular, since the ratio of the measured voltage to the constant voltage is assumed to be similar to the ratio of the distance from the second end of the track 2, i.e. the end of the track 2 on the left side in FIGS. 1 and 3, to the full track length which is known, the position determination system 15 can determine the position of the respective electrical device 3, 13 relative to the second end of the track 15 based on the measured voltage, specifically based on the ratio of the measured voltage and the constant voltage applied to the second electrical conductor 8.

If the position power source 17 is a current source supplying a constant current to the second electrical conductor 8, the position determination system 15 is adapted to determine the position based on the measured voltage, the constant current applied to the electrical conductor 8 and the resistance per length unit of the second electrical conductor 8. In particular, the position determination system 15 can be adapted to determine the position of the respective electrical device 3, 13 in accordance with following equation:

$$P = \frac{U_m}{I_c \sigma}, \qquad (1)$$

wherein P indicates the position of the respective electrical device 3, 13 on the track 2, $U_m$ indicates the measured voltage, $I_c$ indicates the applied constant current and $\sigma$ indicates the resistance per length unit of the second electrical conductor 8. Since the applied constant current and the resistance per length unit of the second electrical conductor 8 are known, the position of the respective electrical device can directly be determined based on the measured voltage in accordance with equation (1), i.e. the absolute position of the respective electrical device can directly be determined from the measured voltage.

The DC power distribution system 1 further comprises a control system 21 for controlling at least the electrical consumers 13 and optionally also the further components of the DC power distribution system like the position determination system 15 and the position power source 17. In particular, the control system 21 can be adapted to control the electrical consumers 13 depending on their determined positions. For instance, if the electrical consumers 13 include several luminaires and several presence detectors for detecting whether a person is close to the respective presence detector, the control system can be adapted to control the luminaires, which are close a certain presence detector, depending on whether this certain presence detector has detected the presence of a person or not. For providing this kind of control the determined positions of the luminaires and of the presence detectors are used. For instance, the control system 21 can be adapted to determine assignments between a presence detector and one or several luminaires close to the presence detector, for instance, having a distance to the presence detector being smaller than a predefined threshold, wherein these assignments can be determined based on the determined positions of the luminaires and of the presence detectors. The control system 21 can then control a luminaire depending on whether a presence detector, which has been assigned to this luminaire, detects the presence of a person or not. For example, if this presence detector detects the presence of a person, the luminaires assigned to this presence detector can be switched on, and, if this presence detector does not detect a person, the luminaires assigned to this presence detector can be switched off. The control system 21 can comprise control rules defining assignments between presence detectors and luminaires depending on their positions, wherein the control rules can be based on, for instance, predefined maximal distances between a presence detector and luminaires assigned to this presence detector.

If the DC power distribution system 1 comprises electrical devices 13 which include several luminaires, the control system 21 can also be adapted to control the luminaires depending on their determined positions, in order to provide predefined light effects. For example, the control system 21 can be adapted such that a guiding light effect is provided dragging a person's eye to a certain position like the center of the installation. The determined position information, i.e. the determined positions of the luminaires, can therefore be used by the control system 21 to address the luminaires depending on a predefined location sequence, which defines when light should be provided at which position. The control system 21 can, for instance, be adapted to provide a chasing light effect depending on the determined positions of the luminaires. The control of the electrical devices depending on the determined positions can be regarded as being a commissioning, in particular, as an automatic commissioning, of the electrical devices depending on their positions.

The DC power distribution system 1 further comprises an installation assisting unit 40 for assisting an installer in installing an additional electrical device, wherein the installation assisting unit 40 can be adapted to determine a preferred installation position on the track 2 for the additional electrical device based on the determined positions of the electrical devices 13, 16 already attached to the track. The installation assisting unit 40 comprises installation rules, which define preferred installation positions based on the positions of the electrical devices 16, 13 already attached to the track. For instance, the installation rules can define that the loads caused by the electrical consumers should be evenly distributed among the power supply units, i.e. that the current flows should be distributed as evenly as possible. Thus, for instance, if the determined positions of the electrical consumers and of already attached power supply units indicate a cumulation of electrical consumers in a certain region along the track, whereas all or most power supply units are attached in other regions along the track, the installation assisting unit 40 can determine a preferred installation position for an additional power supply unit being close or adjacent to the region with the cumulated electrical consumers. For example, in the situation shown in FIG. 1 the installation assisting unit 40 can determine that an additional power supply unit should be installed at the right end of the track 2 such that the loads caused by the electrical consumers 13 are evenly distributed on the two power supply units on the left and right ends of the track 2. The installation assisting unit 40 can comprise an indication unit like a display for indicating the determined preferred installation position.

Figure 4:
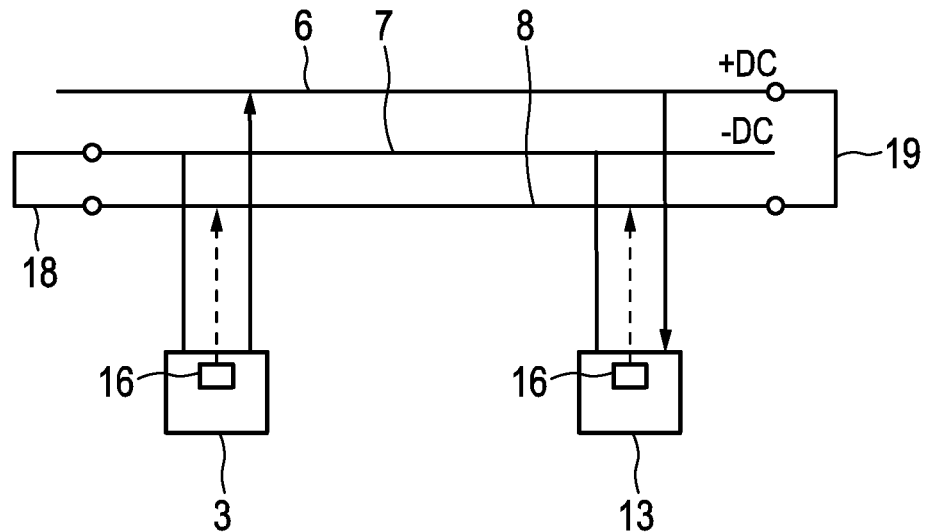

In a further embodiment the DC power distribution system may not comprise the position power source 17, wherein in this case the first electrical conductor 6 is preferentially electrically connected to the second electrical conductor 8 for using the first DC power provided by the power supply unit 3 to the first electrical conductor 6 for providing the second DC power on the second electrical conductor 8. FIG. 4 shows schematically and exemplarily how in this embodiment the power supply unit 3 and the electrical consumers 13 can be electrically connected to the first electrical conductor 6, the reference electrical conductor 7 and the second electrical conductor 8.

As schematically and exemplarily shown in FIG. 4, one end of the second electrical conductor 8 can be electrically connected to the first electrical conductor 6 via a connection element 19 like a jumper and the other end of the second electrical conductor 8 can be electrically connected to the reference electrical conductor 7 by the connection element 18. The power supply unit 3 and the electrical consumers 13 are electrically connected to the electrical conductor 6, 7, 8 as described above with reference to FIG. 3. Also in this embodiment the ratio of the voltage measured by the respective electrical device 3, 13 and the voltage applied to the second electrical conductor 8 is similar to the ratio of the distance of the position of the respective electrical device to the second end of the track being in FIG. 1 the left end of the track 2 and the total length of the track 2. Thus, also in this embodiment the position determination system 15 can be adapted to determine the position of the respective electrical device based on the ratio of the measured voltage and the voltage applied to the second electrical conductor 8.

Figure 5:
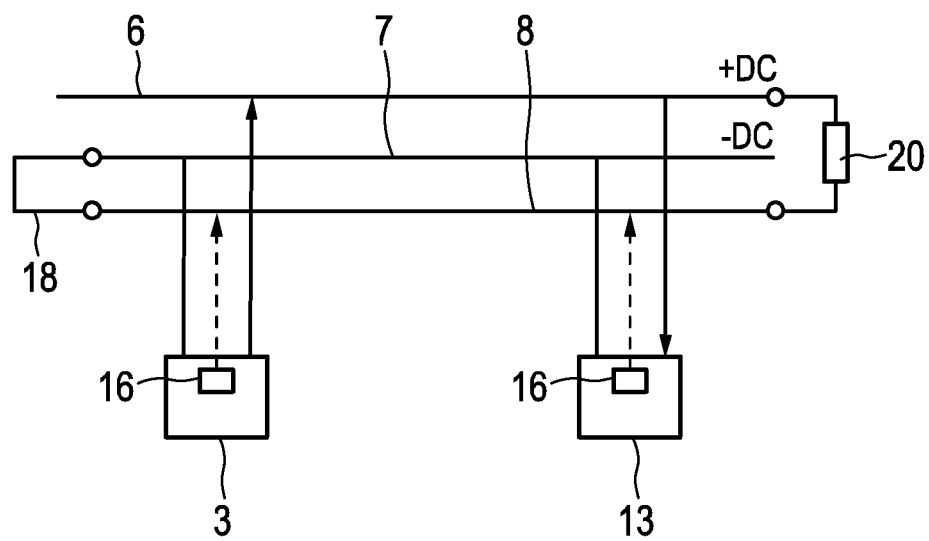

If the DC power distribution system does not comprise the position power source 17, the electrical connection can also be as schematically and exemplarily shown in FIG. 5. Particularly, a resistor 20 can connect the first electrical conductor 6 and a first end of the second electrical conductor 8, wherein a second end of the second electrical conductor 8 can be electrically connected to the reference electrical conductor 7 by using the connection element 18. The electrical connections of the power supply unit 3 and the electrical consumers 13 to the electrical conductor 6, 7, 8 are similar to the corresponding electrical connections described above with reference to FIGS. 3 and 4. The resistor 20 has preferentially a resistance being large relative to the resistance of the full length of the second electrical conductor 8 such that the current through the second electrical conductor 8 is substantially independent of the track length. Thus, also in this case the current applied to the second electrical conductor 8 can be regarded as being substantially constant such that also in this embodiment the position determination system 15 can be adapted to determine the position based on the measured voltage in accordance with above equation (1).

Figure 6:
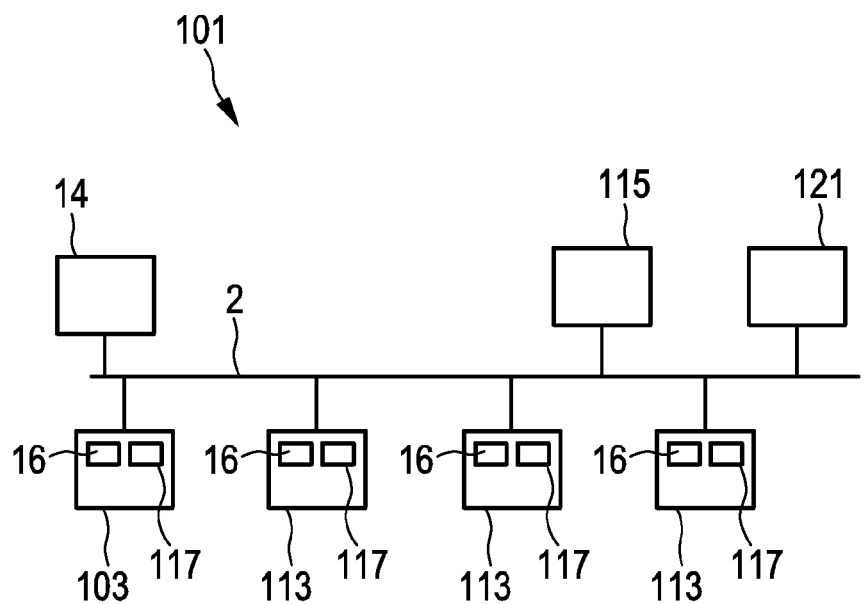
FIG. 6 shows schematically and exemplarily a further embodiment of a DC power distribution system.

FIG. 6 shows schematically and exemplarily a further embodiment of a DC power distribution system. In FIG. 6 the DC power distribution system 101 comprises a track 2 including the electrical conductors arranged along the length of the track 2 for distributing DC power along the track 2 for powering purposes and for position determination purposes. The track 2 further comprises the electrical conductors for providing AC power to a power supply unit 103 and the electrical conductors for communication purposes. The track 2 is similar to the track described above with reference to FIGS. 1 and 2.

Electrical devices are attached to the track 2, wherein the electrical devices include the power supply unit 103 and electrical consumers 113 being preferentially luminaires. However, at least some of the electrical consumers 113 can also be other electrical loads like sensors, loudspeakers, et cetera. The electrical devices are electrically connected to the electrical conductors of the track 2, wherein the electrical devices 103, 113 comprise each a voltage measurement unit 16 for measuring the voltage on the second electrical conductor 8 at the position of the respective electrical device 103, 113. The DC power distribution system further comprises a position determination system 115 for determining the position of the respective electrical device 103, 113 based on the respective measured voltage. A DC power supply system is formed by the power supply unit 103 for supplying first DC power for powering the electrical consumers 113 and by position power providing units 117 assigned to the electrical devices 103, 113. In this embodiment each of the electrical devices 103, 113 comprises such a position power providing unit 117.

The position power providing units 117 can be power supplies. Moreover, the position power providing units can also be a control means of the respective electrical device, wherein a logical output of the control means can be used for providing the second DC power. In this case the second DC power can be provided by applying a DC voltage of, for instance, 5 V. The position power providing units can also be adapted to make temporally a connection between the first electrical conductor 6 and the second electrical conductor 8, for instance, by means of a semiconductor switch, in order to supply the first DC power as the second DC power to the second electrical conductor 8 at the position, at which the respective electrical device is attached to the second electrical conductor 8. For instance, if the first DC power is supplied by applying 48 V to the first electrical conductor 6, the position power providing units 117 can be adapted to apply the 48 V also to the second electrical conductor 8 at the position, at which the respective electrical device is attached to the track.

The electrical devices can also be adapted such that they can electrically connect the second electrical conductor 8 to the reference electrical conductor 7 such that the voltage applied to the second electrical conductor 8 at a certain position by a certain electrical device drops between this electrical device providing the voltage and another electrical device having electrically connected the second electrical conductor 8 to the reference electrical conductor 7.

The position determination system 115 is adapted to determine the position of a first electrical device of the multitude of electrical devices 103, 113 relative to the position of a second electrical device of the multitude of electrical devices 103, 113 based on the voltage measured by one of the first and second electrical devices, i.e. by the respective voltage measurement unit 16, while the position power providing unit 117 assigned to the other of the first and second electrical devices has supplied the second DC power to the second electrical conductor 8. In particular, the DC power distribution system 101 is adapted such that the position power providing unit 117 supplies the second DC power for position determination purposes temporally sequentially, wherein, if a position power providing unit 117 assigned to a certain electrical device 103, 113 supplies the second DC power for position determination purposes, the voltage measurement units 16 of the other electrical devices 103, 113 measure the respective voltage, wherein the position determination system 115 is adapted to determine the positions of these electrical devices relative to the certain electrical device based on the measured respective voltages. Also in this case a constant voltage or a constant current can be provided by the position power providing units, wherein the relative positions can be determined similar to the determination procedures described above for the constant voltage applied to the entire second electrical conductor 8 or the constant current applied to the entire electrical conductor 8.

For instance, if in an embodiment the positions of ten electrical devices should be determined, which may be indicated by A, B, C, D, E, F, G, H, I, K in this sequence from left to right, the different electrical devices may apply a voltage of 48 V to the second electrical conductor 8, optionally connect the second electrical conductor 8 with the reference electrical conductor 7 and measure the voltages on the second electrical conductor 8 in a certain sequence. In each step of this sequence positional information can be obtained, which can be gathered for finally providing the positions of the different electrical devices. For example, if the electrical device C applies 48 V to the second electrical conductor 8 and if the electrical device G electrically connects the second electrical conductor 8 to the reference electrical conductor 7, at the positions of the electrical devices A and B substantially 48 V will be measured, at the positions of the electrical devices H, I and K substantially 0 V will be measured and at the positions of the electrical devices D, E and F voltages will be measured, which are between 48 V and 0 V. The voltages measured by the electrical devices D, E and F can be used for determining the distance of these electrical devices to the electrical device C applying the 48 V to the second electrical conductor 8 relative to the distance between the electrical devices C and G. Moreover, from these voltage measurements it can be deduced that the electrical devices A and B are on the left side with respect to the electrical device C and the electrical devices H, I and K are on the right side with respect to the electrical device G. Moreover, it can be concluded that the electrical devices D, E and F are arranged between the electrical devices C and G. In the next step of the control sequence another electrical device can apply the 48 V to the second electrical conductor 8 and another electrical device can electrically connect the second electrical conductor 8 to the reference electrical conductor 7. Then, the voltages can be measured again at the different positions of the electrical devices and further distance information can be determined from the measured voltages. These steps can be repeated, until enough information has been gathered for determining the positions of the different electrical devices. The switching patterns may be predefined or they may be rather random, wherein by memorizing the results obtained after each step of the switching sequence finally the position of each electrical device can be determined.

The DC power distribution system 101 further comprises a control system 121 for controlling the electrical devices and the position determination system of the DC power distribution system. Also the other described embodiments of the power distribution system can comprise such a control system. In the embodiment shown in FIG. 6 the control system 121 can be adapted to control the electrical devices such that the position power providing units supply the second DC power for position determination purposes and optionally electrically connect the second electrical connector 8 with the reference electrical conductor 7 temporally sequentially and such that the corresponding voltage measurements are performed by the voltage measurement units 16 as described above.

Figure 7:
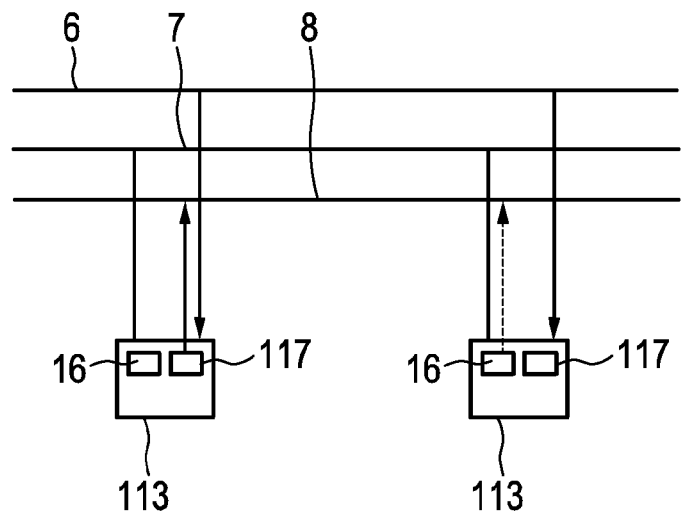
FIG. 7 shows schematically and exemplarily electrical connections of electrical devices attached to a track of a DC power distribution system and of electrical conductors of the track.

FIG. 7 schematically and exemplarily illustrates the determination of the positions of the electrical devices 113 relative to each other along the track 2. In the situation shown in FIG. 7 the left electrical consumer 113 provides the second DC power to the second electrical conductor 8 via the position power source 117 and the right electrical consumer 113 measures the voltage on the second electrical conductor 8, to which the second DC power has been supplied, by using the voltage measurement unit 16. The measured voltage is used by the position determination system 115 as described above for determining the position of the left or right electrical device 113 relative to the other of the two electrical devices 113 shown in FIG. 7.

The different units and systems of the DC power distribution system can communicate with each other via the fourth electrical conductors 9, 10, 11 of the track 2. For instance, the control system of the DC power distribution system can send control commands via the fourth electrical conductors 9, 10, 11 for controlling the different units and systems. In other embodiments also other communication systems can be used for allowing the different units and systems to communicate with each other like a wireless communication system such as Zigbee.

Figure 8:
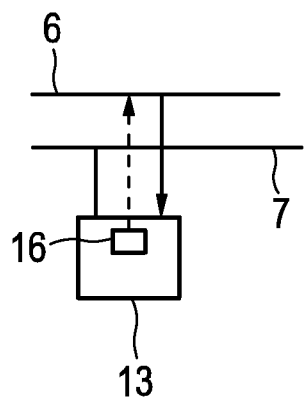
FIG. 8 shows schematically and exemplarily further electrical connections between electrical conductors of a track of a DC power distribution system and an electrical device attached to the track.

In a further embodiment of the DC power distribution system can comprise a DC power supply system being adapted to provide the same DC power on the same electrical conductor for powering purposes and for position determination purposes. In this case, the second electrical conductor can be omitted and the voltage measurement units of the electrical devices are adapted to measure the voltage on the first electrical conductor which is used for supplying the DC power for powering the electrical consumers. Thus, in this embodiment the DC power for powering the electrical consumers is also used for determining the positions of the electrical devices. Referring to FIG. 1, in this case the position power source 17 will not be present and the electrical connections of the electrical devices are preferentially as schematically and exemplarily shown in FIG. 8. Thus, an electrical consumer 13 can receive the DC power from the first electrical conductor 6 for powering the electrical consumer 13 and the voltage measurement unit 16 of the electrical consumer 13 can be adapted to measure the voltage on the first electrical conductor 6.

Figure 9:
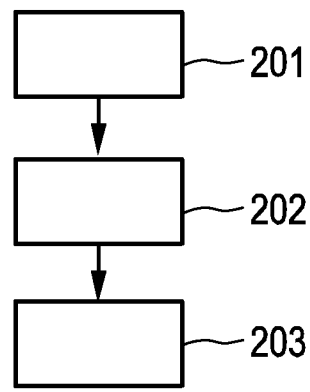
FIG. 9 shows a flowchart exemplarily illustrating an embodiment of a position determination method for determining a position of an electrical device along a track within a DC power distribution system.

In the following an embodiment of a power determination method for determining a position of an electrical device along a track within a DC power distribution system will exemplarily be described with reference to a flowchart shown in FIG. 9.

In step 201 DC power is distributed along the track for powering purposes and for position determination purposes by using electrical conductors of the track arranged along the length of the track, wherein the DC power is supplied by a DC power supply system electrically connected to at least one of the electrical conductors. For instance, the DC power supply system may be formed by a power supply unit electrically connected to a first electrical connector for providing a first DC power for powering purposes and by a position power source for providing second DC power for position determination purposes. In step 202 a voltage is measured on at least one of the electrical conductors at a position of the electrical device, at which the electrical device is attached to the track and electrically connected to the electrical conductors, by a voltage measurement unit of the electrical device. Preferentially, the voltage measurement unit measures the voltage at the second electrical conductor of the track. In step 203 the position of the electrical device is determined based on the measured voltage by a position determination system.

The DC power distribution system is preferentially a track lighting system, wherein at least one of the electrical consumers is a luminaire. The electrical conductors are preferentially isolated embedded copper conductors which are fixed to the substantially U-shaped carrying profile of the track. The electrical consumers and the track are preferentially adapted such that the electrical consumers can be mechanically fixed and electrically connected to the copper conductors at any position on the track.

In the track preferentially AC power is distributed over the length of the track by corresponding electrical conductors such that the AC mains connection, i.e. the connection of the AC power supply, to the track can be at any position on the track. This mains connection is preferentially substantially independent of the position of the one or several power supply units on the track.

The one or several power supply units comprise preferentially AC/DC converters for converting the AC power provided by the AC power supply to the DC power for powering the electrical consumers, i.e. to the first DC power. The one or several power supply units are electrically connected to the AC mains rail, i.e., for instance, to the third electrical conductors 4, 5, and are adapted to output the DC link voltage, i.e. the DC power for powering the electrical consumers, on the DC rail, i.e., for instance, on the first electrical conductor 6. A connection to the control lines 9, 10, 11 may be used or not dependent on the control functionality of the respective unit.

As mentioned above, at least some of the electrical consumers are preferentially luminaires being electrically connected to the DC rail and the control conductors. If the respective luminaire comprises a luminaire driver, the luminaire driver may be adapted to convert the DC link voltage, i.e. the first DC power, to the luminaire drive current as required by a light source of the luminaire. Depending on the system functionality also the luminaire can be electrically connected to the control link to control luminaire parameters like the light intensity, the color, et cetera.

Figure 10:
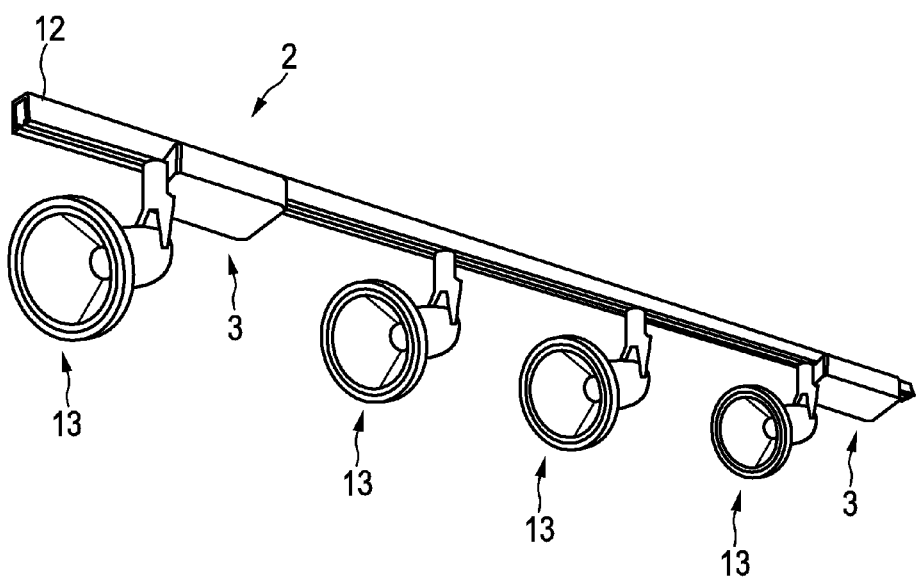
FIG. 10 shows schematically and exemplarily a perspective view of some electrical devices attached to a track of a DC power distribution system.

The one or several power supply units with the AC/DC converters can be arranged in a separate housing, i.e. a housing being separate from the electrical consumers, that may be adapted to be directly clickable on the track. However, a power supply unit can also form an integrated device together with an electrical consumer or with a control unit for controlling one or several electrical consumers. This control unit can provide a user interface like a rotatable button for modifying, for instance, the intensity of the luminaires. The DC power distribution system can also comprise a separate control unit of this kind, which may be clickable on the track. FIG. 10 shows schematically and exemplarily some luminaires 13 attached to the track 2, wherein some luminaires 13 form together with a respective power supply unit 3, an integrated unit in a perspective view.

In known track lighting systems there is no way how track components can know about their relative or absolute position, although, for instance, for commissioning of the DC power distribution system this position information may be very valuable. Moreover, in the DC power distribution system the current distribution can be a very important parameter, which could be optimized when signaling installers where to install additional electrical consumers or power supply units. The corresponding installing information can be provided depending on the determined positions of the power supply units and/or electrical consumers already attached to the track. For determining the positional information a resistive conductor like a resistive wire, i.e. the second electrical conductor in the above described embodiments, can be added to a track device, i.e. to a power bar in accordance with version 1.1 of the EMerge standard. Each electrical device attached to the track may or may not have a connection means being adapted to electrically connect the electrical device to the additional resistive conductor depending on whether the position of the respective electrical device on the track should be determined or not. At both ends of the track the resistive conductor gets preferentially connected, wherein on one side the resistive conductor is preferentially directly connected to a reference electrical conductor which is preferentially a ground electrical conductor.

Figure 3:
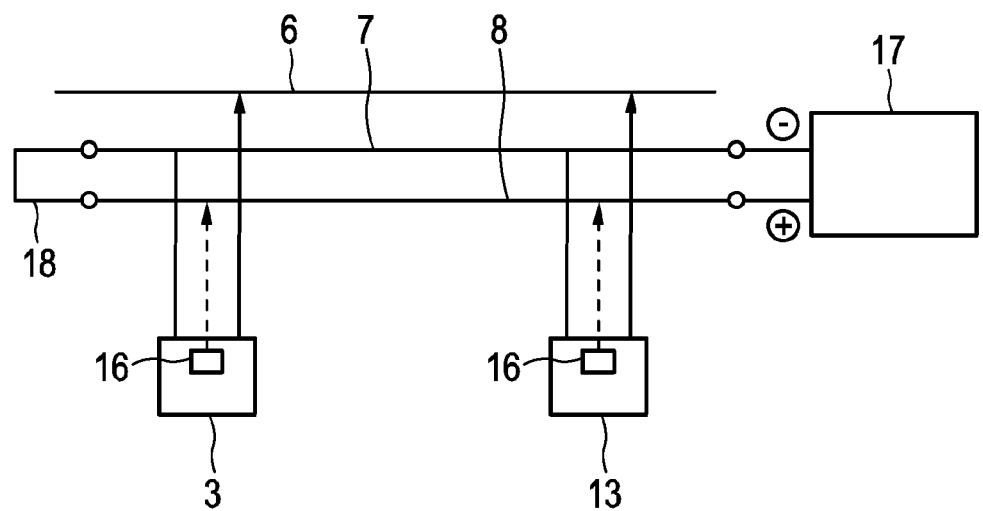
FIGS. 3 to 5 show schematically and exemplarily preferred electrical connections of electrical devices attached to the track and electrical conductors of the track.

The track can comprise two end pieces, wherein a first end piece, in FIG. 3 on the left side, can comprise the connection element 18 and a second end piece, on the right side in FIG. 3, can comprise the position power source 17.

If in the configuration shown in FIG. 3 the position power source is a voltage source providing a constant voltage, the full constant voltage of the position power source drops over the resistive conductor, i.e. over the second electrical conductor 8. At the place where the respective electrical device 3, 13 is mounted to the track 2, the position related voltage between the reference electrical conductor 7 and the second electrical conductor 8 can be monitored. The relation between the full constant voltage and the position related voltage is assumed to be the same as the relation of the full track length and the distance from the left end of the track in FIG. 1, i.e. if a left end piece includes the connector 18, the distance from the left end piece. Thus, the relative position of the respective electrical device can be determined.

As described above with reference to FIG. 2, the second electrical conductor is preferably embedded like the other electrical conductors in the track 2 and fixated by isolation means. In comparison to electrical devices in accordance with version 1.1 of the EMerge standard the electrical device can have an additional contact, which contacts the second electrical conductor 8, if the respective electrical device is attached to the track 2.

Figure 2:
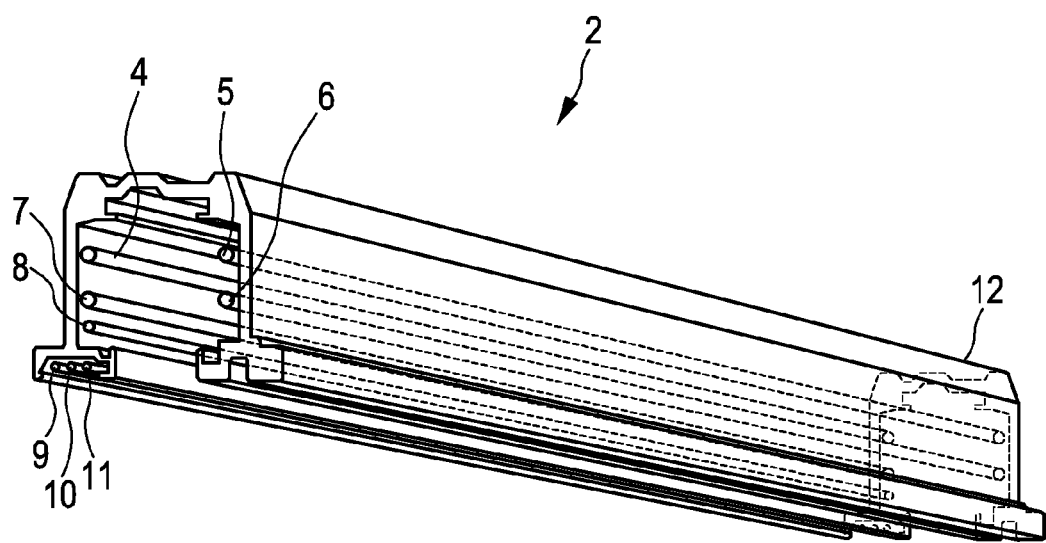
FIG. 2 shows schematically and exemplarily a track of the DC power distribution system.

Although, as schematically and exemplarily shown in FIG. 2, the carrier element 12 has a certain shape and the electrical conductors are arranged in a certain way at the carrier element 12, in other embodiments the carrier element 12 can also have another shape and the electrical conductors can be arranged in another way. For instance, although in FIG. 2 the second electrical conductor is arranged next to the reference conductor and to the first electrical conductor inside the U-shaped profile, the second electrical conductor can also be placed outside the U-shaped profile like the communication conductors 8, 10, 11 shown in FIG. 2. It is however preferred that the second electrical conductor 8 is placed next to the reference electrical conductor 7 as interferences due to, for instance, magnetic fields will then have less impact on the position measurement accuracy. Moreover, since the DC power provided for position determination purposes, i.e., for instance, the corresponding voltage, is relatively low, high isolation and distance requirements have not to be obeyed between the reference electrical conductor and the second electrical conductor.

Although in the above described embodiments the reference electrical conductor is an electrical wire like a copper conductor, in other embodiments the reference electrical conductor can also be formed by a metallic housing of the track.

Figure 11:
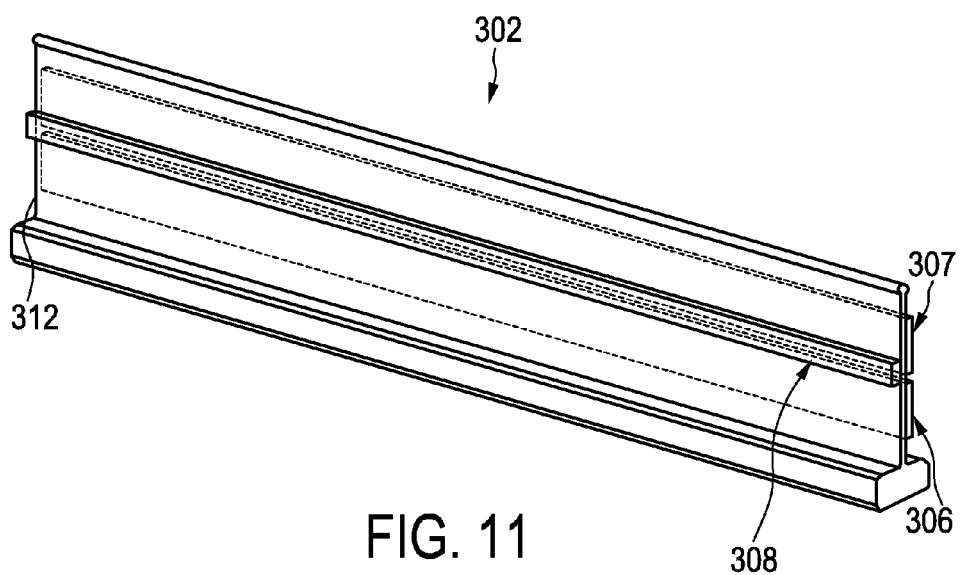
FIG. 11 shows schematically and exemplarily an embodiment of a track of a DC power distribution system.

Moreover, in an embodiment the track may not comprise electrical conductors for distributing the AC power and/or may not comprise electrical conductors for communication purposes. For instance, in an embodiment a track may be formed as schematically and exemplarily shown in FIG. 11. In FIG. 11, the track 302 comprises a carrying element 312 being substantially T-shaped, wherein in this embodiment the first electrical conductor 306 for supplying the DC power for powering purposes, the reference electrical conductor 307 and the second electrical conductor 308 for providing DC power for position determination purposes are formed as resistive layers, for instance, as known from potentiometers, attached to the carrying profile 312. The resistive layers can also be used with other carrying elements like the carrying element 12 shown in FIG. 2.

The track is preferentially installed at a ceiling of a room for powering different electrical consumers like luminaires at the ceiling. The track is therefore preferentially used for powered ceiling purposes.

In the embodiment described above with reference to FIG. 4 the connection elements 18 and 19 can be provided in respective end pieces of the track 2. These end pieces may only contain the connection elements 18, 19 being preferentially jumpers. The respective electrical device can be adapted to monitor the DC voltage between the first electrical conductor 6 and the reference electrical conductor 7 supplied by the power supply unit 3 and the position related voltage between the reference electrical conductor 7 and the second electrical conductor 8 at the position at which the respective electrical device is attached to the track. The relation between the full voltage between the reference electrical conductor 7 and the first electrical conductor 6, i.e. the DC voltage supplied by the power supply unit 3, and the position related voltage is preferentially the same as the relation of the full track length and the distance of the respective electrical device along the track from the left end of the track in FIG. 4. Thus, also in this setup a relative position of the respective electrical device along the track can be measured.

As already mentioned above, the position power source can also be a current source, i.e. an auxiliary power supply can be used for providing a constant current to the second electrical conductor 8, or a constant current can be provided by using the DC power supplied over the first electrical conductor 6 and the reference electrical conductor 7, in particular, as schematically and exemplarily shown in FIG. 5.

If the position power source 17 is a current source, the electrical connections are preferentially as schematically shown in FIG. 3, wherein in FIG. 3 the electrical connector 18 on the left side can be arranged in a left handed end piece of the track 2 and the current source 17 can be arranged in a right handed end piece of the track 2. In FIG. 3, if the position power source 17 is a current source, the position related voltage measured by the respective voltage measurement unit 16 between the reference electrical conductor 7 and the second electrical conductor 8 at the position of the respective electrical device gives an absolute position measured from the left end of the track 2. At the right end of the track a voltage representing the length of the track can be monitored. For instance, if the constant current delivered by the current source 17 is 0.01 A, if the resistant of the second electrical conductor 8 is 10 Ω/m and if the track has a length of 10 m, at the right end of the track a voltage of 10 Ω/m·10 m·0.01 A=1V can be measured. An electrical device like a power supply unit or electrical consumer placed 1.5 m from the left end of the track will monitor a voltage of 10 Ω/m·1.5 m·0.01 A=150 mV.

In the configuration exemplarily and schematically illustrated in FIG. 5 the electrical connector 18 can be arranged in a first end piece and the resistor 20 can be arranged in a second end piece of the track. The resistor 20 has a resistance being large in comparison to the resistance of the full length track in the second electrical conductor 8 such that the current through the second electrical conductor 8 is substantially independent of the track length and, thus, of the position on the track at which the voltage is measured. For instance, if the power supply unit 3 can provide a DC voltage of 48 V, if the resistor 20 has a resistance of 4700Ω and if the second electrical conductor 8 has a resistance of 10 Ω/m, for possible track lengths between, for instance, 1 m and 20 m the resistance of the second electrical conductor 8 over the full track length will be between 10 and 200Ω and therefore much smaller than 4700Ω. If in this example the track has a length of 10 m, at the right end of the track a voltage of 10 Ω/m·10 m·0.01 A=1V can be measured, wherein an electrical device placed 3 m from the left will measure a voltage of 10 Ω/m·3 m·0.01 A=150 mV.

Figure 12:
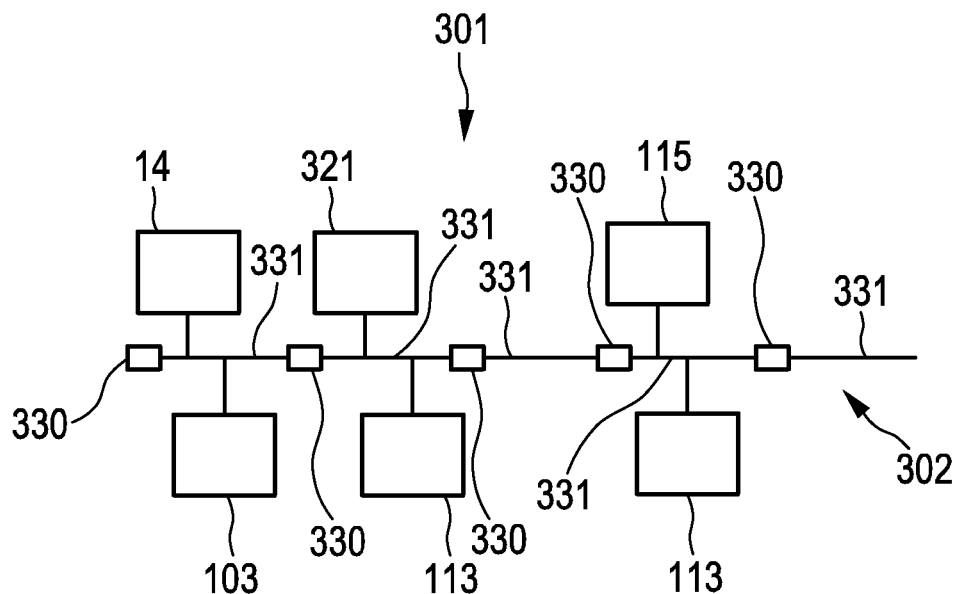
FIG. 12 shows schematically and exemplarily a further embodiment of a DC power distribution system.

The DC power distribution system can comprise one or several tracks. If the DC power distribution system comprises several tracks, consecutive tracks, i.e. consecutive track segments, can simply be connected by electrically connecting the corresponding electrical conductors of the track segments, in particular, the second electrical conductor distributing the DC power for position determination purposes in the different track segments are electrically connected. If they contain measuring means, they can also determine their relative or absolute position on the track. FIG. 12 shows schematically and exemplarily an embodiment of such a DC power distribution system comprising a track formed by several track segments.

In FIG. 12, the DC power distribution system 301 comprises a track 302 formed by several track segments 331, wherein each track segment is similar to the track 2 shown in FIG. 2. Thus, the track segments 331 comprise a first electrical conductor 6 for distributing first DC power for powering purposes, a second electrical conductor 8 for distributing second DC power for position determination purposes, third electrical conductors 4, 5 for distributing AC power, fourth electrical conductors 9, 10, 11 for communication purposes and a reference electrical conductor 7 being preferentially a ground conductor.

The DC power distribution system 301 further comprises several electrical devices 103, 113, 330 attached to the track segments 331 and electrically connected to the electrical conductors, wherein the electrical devices include a power supply unit 103 and electrical consumers 113 as described above with reference to FIG. 6. The electrical devices further include further electrical devices 330 for being attached to the frontal ends of the track segments 331. If they are attached to frontal ends of neighboring track segments 331, they can be regarded as being connection elements for connecting two neighboring track segments 331. The connection elements are adapted such that the several electrical conductors of the two neighboring track segments are electrically coupled, in order to distribute the powers via the respective connection element and in order to provide a continuous communication line. Each of these further electrical devices 330, which may be regarded as being connection elements, is attached to and thus assigned to a certain track segment 331 such that by determining the position of these further electrical devices 330 the position of the respective track segment 331 within the track 302 can be determined.

Although in the described embodiment the further electrical devices 330 for determining the positions of the track segments 331 are attached to the frontal ends of the track segments 331, in other embodiments the further electrical devices for determining the position of the respective track segment can also be attached in another way to the respective track segment. For instance, they can be attached to the inside of the respective track segment, i.e. they can be integrated in the respective track segment, such that the track segment is already provided with the electrical device. Or, the electrical device may be provided within a housing of the respective track segment.

Figure 13:
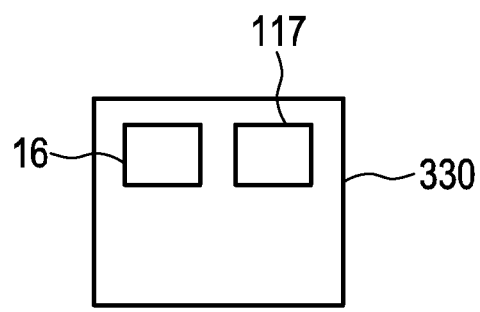
FIG. 13 shows an embodiment of an electrical device of the DC power distribution system shown in FIG. 12.

FIG. 13 shows schematically and exemplarily a further electrical device 330, which may be regarded as being a connection element, in more detail. As can be seen in FIG. 13, the further electrical device 330 comprises a voltage measurement unit 16 for measuring the voltage on the second electrical conductor 8, i.e. between the reference electrical conductor 7 and the second electrical conductor 8, and a position power providing unit 117 for providing the second DC power for determining the positions of the electrical devices.

A DC power supply system is formed by the power supply unit 103 for supplying first power for powering the electrical consumers 113 and by the position power providing units 117 assigned to the electrical devices 103, 113, 330. In this embodiment each of the electrical devices 103, 113, 330 comprises such a position power providing unit 117.

The DC power distribution system 301 further comprises a position determination system 115 for determining the position of the respective electrical device 103, 113, 330 based on the respective measured voltage. The positions of the electrical devices of the DC power distribution system 301 can be determined as described above with reference to the other embodiments of the DC power distribution system. In particular, the positions of the electrical devices can be determined as described above with reference to FIGS. 6 and 7.

The DC power distribution system 301 further comprises an AC power supply 14 for providing AC power to the third electrical conductors 4, 5, which can then be converted into the first DC power by the power supply unit 103. Moreover, the DC power distribution system 301 comprises a control system 321 for controlling the electrical devices 103, 113, 330 and optionally further components like the position determination system 115.

The further electrical devices 330, which may be regarded as being connection elements, can be adapted to isolate certain track segments, for instance, they can comprise a switch for connecting and disconnecting a track segment to and from, respectively, a neighboring track segment. This switching can be used to, for instance, change the current balance in the system, to isolate a short circuit in the system, et cetera. The switch is preferentially controlled by the control system 321 based on the determined positions of the track segments. For instance, based on the position information obtained from the position determination system 115 the control system 321 can determine that the track segment 331 at the right end of the track 302 in FIG. 12 does not comprise any electrical device. The control system 321 can therefore control the connection element 330 attached to this right track segment 331 such that this track segment is isolated and disconnected from the other track segments. Generally, the control system 321 can comprise control rules defining the control of the different elements of the DC power distribution system 301 depending on the determined positions of the electrical devices 103, 113, 330.

If a track does not comprise several sub tracks, i.e. if a track is not segmented, but manufactured in one piece, the functions at the ends of the track like the electrical connections and the provisions of the positional power for being applied to the second electrical conductor, for instance, the respective end pieces, can be integrated with the track.

For instance, regarding the embodiment described above with reference to FIG. 4, a track can be manufactured, in which the second electrical conductor 8 is already directly bridged to the reference electrical conductor 7 at one side and on the other side the second electrical conductor 8 is already bridged to the first electrical conductor 6. If in this case a constant voltage is supplied, the voltage is divided over the track length of, for instance, 5 m, and the measured voltage gives a direct measure for the relative position along this track length. Moreover, in the configuration shown in FIG. 5 at one end of the track the second electrical conductor 8 and the reference electrical conductor 7 may already be bridged and at the other end of the track the first electrical conductor 6 and the second electrical conductor 8 may already be connected via the resistor 20 for using a constant current for determining the position of the respective electrical device.

Different electrical devices on the track can contain a switching and measurement circuit to determine the relative positions between the individual electrical devices on the track. In particular, each electrical device can supply a voltage or a current to the second electrical conductor, while other electrical devices can measure the resulting voltage and/or current at their connector to the second electrical conductor, from which the resistance of the wire between the electrical devices and, thus, the relative position can be determined. The switching and measurement circuit, which can also be regarded as being a control circuit, can be part of the respective electrical device and can be adapted to operate the electrical devices in a time sequential order such that only one electrical device is supplying a voltage and/or a current, while the other electrical devices measure the results. In a next sequence another electrical device supplies the voltage and/or the current, while the other electrical devices measure the results. The control circuits can be adapted to exchange commands between the electrical devices via the communication electrical conductors for synchronizing the operations of the different electrical devices.

The second electrical conductor can be combined with other functionalities of the DC power distribution system. For instance, the second electrical conductor can be used for control signals, sending DC power, for instance, supplying relatively small DC voltage of 5 V or providing a low current power line, the voltage on the second electrical conductor can be moved above a certain predefined threshold voltage for switching the electrical consumers, especially luminaires, on or off, et cetera. Moreover, existing lines in the rail, i.e. electrical conductors arranged along the length of the track as defined in version 1.1 of the EMerge standard, can also be used for position determination purposes. For instance, the voltage drop over the DC power line, i.e. over the electrical conductor used for providing the DC power for powering the electrical consumers, could be measured.

The DC power distribution system is preferentially a rail oriented lighting system like a track lighting system for retail. The DC power distribution system can also be regarded as being a powered ceiling structure like the system promoted by the EMerge Alliance.

If the position power source is a current source providing a constant current, it can be a precision current source or another kind of current source.

Although in above described embodiments the reference electrical conductor 7 has a relatively low resistance, for instance, is a copper wire, whereas the second electrical conductor 8 has a relatively high resistance and is, for instance, a constantan wire, in other embodiments also the reference electrical conductor 7 may have a relatively high resistance and may be made of, for instance, constantan. In this case, preferentially the DC power distribution system is configured such that the supply current does not run through the reference electrical conductor 7, in order to keep measurement errors small. Moreover, the electrical device is then preferentially adapted to measure a voltage drop two times, because the reference electrical conductor 7 and the second electrical conductor 8 connected in series build a resistive loop.

In particular, at a first end of the track a minus terminal of a position power source may be connected to the electrical conductor 7 and a plus terminal of the position power source may be connected to the electrical conductor 8. At the opposing second side of the track the electrical conductor 7 and the electrical conductor 8 may be connected to each other, i.e. there may be a bridge between the electrical conductors 7, 8. The voltage measurement unit of the respective electrical device can then be adapted to measure the voltage at the electrical conductor 7 and the voltage at the electrical conductor 8, wherein the position determination system can be adapted to determine the position of the respective electrical device based on the difference between these two voltages. For instance, if the power position source applies a voltage of 48 V, at the first end of the track the voltage measured on the electrical conductor 7 will be zero and the voltage measured on the electrical conductor 8 will be 48 V. Thus, the difference will be 48 V. At the second end of the track the voltage drops in the two electrical conductors 7, 8 lead to a measured voltage of 24 V on the electrical conductor 7 and a measured voltage of also 24 V on the electrical conductor 8. Thus, at the second end of the track the difference between the two measured voltages will be zero. In between the first end of the track and the second end of the track the difference between the measured voltages will be between 48 V and 0 V, wherein the measured difference will linearly change with the position between the first and second ends of the track. Thus, the position of the respective electrical device can easily be determined based on the measured voltage difference.

Although in above described embodiments certain kinds of commissioning based on the determined positions of the electrical devices have been described, in other embodiments the commissioning of the electrical devices depending on their determined positions can also be performed in another way, for example, the electrical devices can be controlled in another way depending on their positions. For instance, also power supply units or other electrical consumers not being luminaires or presence detectors can be controlled depending on their determined positions. Moreover, the above described automatic binding between different kinds of electrical devices like presence sensors and luminaires can also be performed in another way such that the automatic binding is based on other control rules or other kinds of electrical devices are automatically bound.

Components and functions described above as being used in a certain embodiment of the DC power distribution system can also be used in another embodiment. For instance, the further electrical devices being attached to the track segments for determining the positions of the track segments within a track described above with reference to FIGS. 12 and 13 can also be used in the other embodiments of the DC power distribution system, i.e. also the other embodiments of the DC power distribution system can comprise track segments forming the respective track, wherein electrical devices can be attached to the track segments, in particular, integrated in the track segments, for determining the positions of the track segments with respect to the track.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Determinations like the determination of the position of the respective electrical device based on the measured voltage performed by one or several units or devices can be performed by any other number of units or devices. These determinations and/or the control of the DC power distribution system, in particular, in accordance with the above mentioned position determination method, can be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention claimed is:

1. A DC power distribution system, the DC power distribution system comprising:
a track comprising electrical conductors arranged along the length of the track for distributing DC power along the track for powering purposes and for position determination purposes,
an electrical device attached to the track and electrically connected to the electrical conductors, wherein the electrical device comprises a voltage measurement unit for measuring the voltage on at least one of the electrical conductors at the position of the electrical device,
a position determination system for determining the position of the electrical device based on the measured voltage,
a DC power supply system electrically connected to at least one of the electrical conductors for supplying DC power to the at least one of the electrical conductors,
wherein the electrical conductors include a first electrical conductor for distributing a first DC power for powering purposes, a reference electrical conductor, and a second electrical conductor for distributing a second DC power for position determination purposes, wherein the voltage measurement unit is adapted to measure the voltage between the reference electrical conductor and the second electrical conductor; and
wherein the DC power supply system is adapted to supply a constant voltage to the second electrical conductor at which the voltage is measured for supplying DC power to be used for position determination purposes, wherein the position determination system is adapted to determine the position based on the ratio of the measured voltage and the constant voltage applied to the second electrical conductor; or
wherein the DC power supply system is adapted to supply a constant current to the second electrical conductor, at which the voltage is measured, for supplying DC power to be used for position determination purposes, wherein the position determination system is adapted to determine the position based on the measured voltage, the constant current applied to the second electrical conductor and the resistance per length unit of the at least one electrical conductor at which the voltage is measured.

2. The DC power distribution system as defined in claim 1, wherein the DC power supply system comprises a position power source supplying the second DC power.

3. The DC power distribution system as defined in claim 1, wherein the first electrical conductor is electrically connected to the second electrical conductor for using the first DC power provided on the first electrical conductor for providing the second DC power on the second electrical conductor.

4. The DC power distribution system as defined in claim 1, wherein the DC power distribution system comprises a multitude of the electrical devices, wherein the DC power supply system includes several position power providing units for providing DC power to the second electrical conductor for position determination purposes, wherein the position power providing sources are assigned to the electrical devices, wherein the position determination system is adapted to determine the position of a first electrical device of the multitude of electrical devices relative to the position of a second electrical device of the multitude of electrical devices based on the voltage measured by one of the first and second electrical devices, while the position power providing unit assigned to the other of the first and second electrical devices has provided the DC power to the second electrical conductor.

5. The DC power distribution system as defined in claim 1, wherein the DC power supply system is adapted to provide the same DC power on the same electrical conductor for powering purposes and for position determination purposes.

6. The DC power distribution system as defined in claim 1, wherein the track is formed by several track segments, wherein the electrical device is attached to a track segment of the several track segments such that by determining the position of the electrical device the position of the track segment, to which the electrical device is attached, within the track is determined.

7. The DC power distribution system as defined in claim 1, wherein the DC power distribution system further comprises a control system for controlling at least one of the electrical device and the DC power supply system depending on the determined position.

8. The DC power distribution system as defined in claim 1, wherein the DC power distribution system further comprises an installation assisting unit for assisting an installer in installing an additional electrical device, wherein the installation assisting unit is adapted to determine a preferred installation position on the track for the additional electrical device based on the determined position of the electrical device already attached to the track.

9. A position determination system being adapted to be used in the DC power distribution system as defined in claim 1, wherein the position determination system is adapted to determine the position of the electrical device based on the measured voltage,
wherein the position determination system is adapted to determine the position based on the ratio of the measured voltage and the constant voltage applied to the second electrical conductor; or
wherein the position determination system is adapted to determine the position based on the measured voltage, the constant current applied to the second electrical conductor and the resistance per length unit of the at least one electrical conductor at which the voltage is measured.

10. A position determination method for determining a position of an electrical device along a track within a DC power distribution system as defined in claim 1, the position determination method comprising:
distributing DC power along the track for powering purposes and for position determination purposes by using the electrical conductors of the track arranged along the length of the track, wherein the DC power is supplied by the DC power supply system to the first electrical conductor for distributing a first DC power for powering purposes, a reference electrical conductor and a second electrical conductor for distributing a second DC power for position determination purposes,
measuring a voltage on at least one of the electrical conductors at a position of the electrical device attached to the track and electrically connected to the electrical conductors by the voltage measurement unit of the electrical device, wherein the voltage measurement unit is adapted to measure the voltage between the reference electrical conductor and the second electrical conductor,
determining the position of the electrical device based on the measured voltage by the position determination system;
wherein the DC power supply system is adapted to supply a constant voltage to the second electrical conductor at which the voltage is measured for supplying DC power to be used for position determination purposes, wherein the position determination system is adapted to determine the position based on the ratio of the measured voltage and the constant voltage applied to the second electrical conductor; or
wherein the DC power supply system is adapted to supply a constant current to the second electrical conductor, at which the voltage is measured, for supplying DC power to be used for position determination purposes, wherein the position determination system is adapted to determine the position based on the measured voltage, the constant current applied to the second electrical conductor and the resistance per length unit of the at least one electrical conductor at which the voltage is measured.

11. A computer program for determining a position of an electrical device along a track within a DC power distribution system, the computer program comprising program code for causing a DC power distribution system to carry out the following steps when the computer program is run on a computer controlling the DC power distribution system:
distributing DC power along the track for powering purposes and for position determination purposes by using the electrical conductors of the track arranged along the length of the track, wherein the DC power is supplied by the DC power supply system to the first electrical conductor for distributing a first DC power for powering purposes, a reference electrical conductor and a second electrical conductor for distributing a second DC power for position determination purposes,
measuring a voltage on at least one of the electrical conductors at a position of the electrical device attached to the track and electrically connected to the electrical conductors by the voltage measurement unit of the electrical device, wherein the voltage measurement unit is adapted to measure the voltage between the reference electrical conductor and the second electrical conductor,
determining the position of the electrical device based on the measured voltage by the position determination system;
wherein the DC power supply system is adapted to supply a constant voltage to the second electrical conductor at which the voltage is measured for supplying DC power to be used for position determination purposes, wherein the position determination system is adapted to determine the position based on the ratio of the measured voltage and the constant voltage applied to the second electrical conductor; or
wherein the DC power supply system is adapted to supply a constant current to the second electrical conductor, at which the voltage is measured, for supplying DC power to be used for position determination purposes, wherein the position determination system is adapted to determine the position based on the measured voltage, the constant current applied to the second electrical conductor and the resistance per length unit of the at least one electrical conductor at which the voltage is measured.

* * * * *